(12) United States Patent
Hayano et al.

(10) Patent No.: US 10,201,069 B2
(45) Date of Patent: Feb. 5, 2019

(54) HIGH FREQUENCY POWER SUPPLY DEVICE AND HIGH FREQUENCY POWER SUPPLYING METHOD

(71) Applicants: PEARL KOGYO CO., LTD., Osaka (JP); ADVANCED MICRO-FABRICATION EQUIPMENT INC, SHANGHAI, Shanghai (CN)

(72) Inventors: Eiich Hayano, Osaka (JP); Takeshi Nakamura, Osaka (JP); Yasunori Maekawa, Osaka (JP); Hiroshi Iizuka, Shanghai (CN); Jinyuan Chen, Shanghai (CN)

(73) Assignees: PEARL KOGYO CO., LTD., Osaka (JP); ADVANCED MICRO-FABRICATION EQUIPMENT INC, SHANGHAI, Shanghai (CN)

( * ) Notice: Subject to any disclaimer, the term of this patent is extended or adjusted under 35 U.S.C. 154(b) by 603 days.

(21) Appl. No.: 14/745,273

(22) Filed: Jun. 19, 2015

(65) Prior Publication Data

US 2015/0289355 A1    Oct. 8, 2015

Related U.S. Application Data

(62) Division of application No. 11/943,759, filed on Nov. 21, 2007.

(30) Foreign Application Priority Data

Nov. 22, 2006   (JP) .................................. 2006-314962

(51) Int. Cl.
*H01J 37/32*   (2006.01)
*H05H 1/46*   (2006.01)

(52) U.S. Cl.
CPC ......... *H05H 1/46* (2013.01); *H01J 37/32091* (2013.01); *H01J 37/32165* (2013.01);
(Continued)

(58) Field of Classification Search
CPC ........... H01J 37/32091; H01J 37/32165; H01J 37/32174; H05H 1/46; H05H 2001/4645
See application file for complete search history.

(56) References Cited

U.S. PATENT DOCUMENTS

| 5,792,272 A | 8/1998 | van Os et al. |
|---|---|---|
| 6,791,274 B1 | 9/2004 | Hauer et al. |

(Continued)

FOREIGN PATENT DOCUMENTS

| CN | 101188901 B | 5/2012 |
|---|---|---|
| EP | 1926352 B1 | 3/2016 |

(Continued)

OTHER PUBLICATIONS

Office Action for U.S. Appl. No. 11/943,759 dated Dec. 19, 2014.
(Continued)

*Primary Examiner* — Yuechuan Yu
(74) *Attorney, Agent, or Firm* — Womble Bond Dickinson (US) LLP; Joseph Bach, Esq.

(57) ABSTRACT

A high frequency power supply device and power supplying method are disclosed, which can rapidly and accurately control power used for generation of plasmas. The device includes a first high frequency power supply, providing power at frequency f1, and a second high frequency power supply providing power at frequency f2 (f1>f2). The first power supply includes: a first high frequency oscillator, which excites the high frequency power at the first frequency and has a variable frequency; a first power amplification block, which amplifies the power of the high frequency oscillator; a heterodyne detection block, which
(Continued)

performs heterodyne detection of a reflected wave; and a first control block, which receives a signal after detection of the heterodyne detection block and a traveling wave signal, and controls an oscillating frequency of the first high frequency oscillating block and an output of the first power amplification block.

12 Claims, 11 Drawing Sheets

(52) U.S. Cl.
CPC .............. *H01J 37/32174* (2013.01); *H05H 2001/4645* (2013.01)

(56) References Cited

U.S. PATENT DOCUMENTS

| | | | |
|---|---|---|---|
| 6,958,630 | B2 | 10/2005 | Watanabe et al. |
| 7,359,177 | B2 | 4/2008 | Yang et al. |
| 2004/0222184 | A1* | 11/2004 | Hayami ............ H01J 37/32082 216/16 |
| 2008/0128087 | A1 | 6/2008 | Hayano et al. |

FOREIGN PATENT DOCUMENTS

| | | |
|---|---|---|
| JP | 9161994 A | 6/1997 |
| JP | 2003179030 A | 6/2003 |
| JP | 2006314962 A | 11/2006 |
| JP | 5426811 B2 | 2/2014 |
| KR | 10-0980165 B1 | 9/2010 |
| TW | I430715 B | 3/2014 |

OTHER PUBLICATIONS

Restriction Requirement for U.S. Appl. No. 11/943,759 dated Jan. 31, 2011.
Restriction Requirement for U.S. Appl. No. 11/943,759 dated May 10, 2011.
Office Action for U.S. Appl. No. 11/943,759 dated Sep. 23, 2011.
Office Action for U.S. Appl. No. 11/943,759 dated Feb. 16, 2012.
Office Action for U.S. Appl. No. 11/943,759 dated Apr. 22, 2014.
Schaepkens, M., et al. "Effects of radio frequency bias frequency and radio frequency bias pulsing on SiO2 feature etching in inductively coupled fluorocarbon plasmas", Mar./Apr. 2000, pp. 856-863, J. Vac. Sci. Technol. B 18(2), 2000 American Vacuum Society.
Mcvittie, J., "Tutorial on Using RF to Control DC Bias", May 2007 PEUG Mtg, 16 pages, Stanford Nanofabication Facility Stanford University.

* cited by examiner

HIGH FREQUENCY POWER SUPPLY DEVICE AND HIGH FREQUENCY POWER SUPPLYING METHOD

RELATED APPLICATIONS

The present application is a divisional application of U.S. patent application Ser. No. 11/943,759, filed on Nov. 21, 2007, which claims the benefit of priority to Japanese Patent Application No. 2006-314962, filed on Nov. 22, 2006, and the disclosures of which are hereby incorporated herein by reference in their entireties.

FIELD OF THE INVENTION

The present invention relates to a high frequency power supply device and a high frequency power supplying method and, in particular, to a high frequency power supply device and a high frequency power supplying method for processing plasmas used in semiconductor device fabrication and the like.

BACKGROUND

A semiconductor device, such as DRAM, SRAM, Flash Memory, Optical Semiconductor Chip, etc., is fabricated through processes of forming a semiconductor layered film on a semiconductor substrate, perforating respective portions through etching, and filling with a metal film etc., so as to realize electrical connections, and further through processes of disposing trenches surrounding prescribed regions and filling with an oxide film so as to realize insulation. In the process of etching the layered film to form holes or trenches, various etching methods can be used, but plasma processing can be used to achieve deep and steep etching with a high aspect ratio, and therefore has been widely adopted for fabrication of most semiconductor devices.

Plasma is generated as follows: a gas for generation of plasmas is injected into an evacuated plasma generation chamber; and high frequency power (generally RF, microwave energy, etc.) is supplied into the plasma generation chamber, thereby forming a high frequency electrical field and generating plasma in the evacuated chamber. In order to precisely control the formation of the semiconductor circuit features, the plasma chamber should be designed so as to properly follow the control instruction. For example, the supply of high frequency power into a plasma processing chamber for generation, stabilization, maintenance, and extinguishing the plasma needs to be carefully controlled. Similarly, generating different levels of plasma densities, from a low density to a high density, shall be carried out with good controllability. Further, plasma processing is also used in formation and/or deposition of various films of the semiconductor device. The controllability of supplying the plasma processing chamber with high frequency power becomes a crucial factor in terms of controlling the characteristics of the formed films.

For the control of supplying the plasma processing chamber with high frequency power, the following control approaches are adopted in a high frequency power supply device. (1) One is an approach in which power is applied to the plasma chamber in the form of incident wave (incident or traveling wave high frequency power Pf). A reflected wave (reflected high frequency power Pr) is detected and fed back to a power amplifier, that is, a method in which a directivity coupler is used to separate the reflected wave (as returned from the plasma processing device) from the incident wave, and detect and feed back the reflected wave to the power amplifier. This is an approach of controlling the high frequency power itself. (2) The other is an approach of using an impedance matcher to achieve matching with the supplied high frequency power. The impedance matcher includes a detection block, which detects a phase difference φ and an impedance Z of a voltage and a current of the high frequency power, an impedance match block consisted of a capacitor C and an inductor L, a servo motor control block, which sets the phase difference detected by the detection block to zero, and automatically adjusts the capacitor C and the inductor L in such a way that a ratio of the voltage to the current becomes the characteristic impedance of a transmission line. The servo motor control block can also use a scale disc controlled manually. A method of using the impedance matcher is a method of controlling an efficiency with which the supplied high frequency power is used effectively for generation of plasma. With the approaches (1) and (2), a control on the supply of high frequency power used for generation of plasma can thus be achieved.

Unfortunately, the following problems are present with respect to the control by means of impedance matching in the approach (2). In the plasma processing device, a load impedance changes sharply before vs. after ignition of the plasma. Consequently, even if the servo motor mechanism together with the impedance matcher is used to achieve matching, various unfavorable situations may occur due to an insufficient follow-up speed. That is, due to inertia of the servo motor, etc., there may be a limitation of shortening the adjustment period, i.e., the response time of the impedance matching, which results in the occurrence of a case in which plasmas can not be generated quickly and stably. Further, a problem of intermediate extinguishing of plasma after it has been already ignited may also occur. In order to address the problems, such a method has been proposed in which the oscillating frequency of a high frequency oscillating block is variable, and additionally a plasma generation detector is disposed to detect the ignition of plasma inside the plasma processing chamber. Upon detection of generation of plasma by the plasma generation detector, the oscillating frequency of the high frequency oscillating block is set to a predetermined fixed frequency at which the plasmas is excited during generation of the plasma. Prior to generation of plasmas, a method can be adopted, in which the phase difference signal is received from the phase difference detector of the impedance matching block, and the oscillating frequency of the high frequency oscillating block is varied to make the phase difference zero. Dependent upon this method, generally referred to in the art as frequency tuning, plasma, after being generated, can be adjusted electrically directly to an optimum fixed frequency, and be supplied with high frequency, and thus can go into a stable status. That is, once the plasma has been ignited it is maintained by a fixed frequency RF source, and thus the impedance matcher can be used to achieve matching since no rapid impedance variations are expected after plasma ignition.

Further, the following problems are present in the approach (1) of feeding back the reflected wave to the high frequency amplifier. In many modern plasma chambers two RF frequencies are used; namely one high frequency for striking the plasma and controlling its ion density (generally referred to as source frequency), and a second, generally lower RF frequency, for controlling the energy of the ions in the plasma (generally referred to as bias frequency). The two RF frequencies are often applied to the same electrodes of the plasma processing chamber in an overlap manner. Consequently, the high frequency signal of the source frequency mixes with the reflected wave of the lower bias frequency. As a result, the reflected waves from the plasma processing chamber are thus formed of a spectrum of frequencies, including frequency-modulated waves and high order harmonics. That is, such a spectrum results, which includes side peaks only deviating a few wavelengths from the frequency of the bias frequency and centering on the source frequency signal. These peaks cannot be separated and detected, and thus become a crucial factor in terms of an error control of the power amplifier. Consequently, the reflected energy cannot be used for accurate frequency tuning.

In order to address these problems, that is, to resolve frequency mixing, such a method has been proposed in which a high frequency at a prescribed frequency is used for heterodyne detection, and this prescribed frequency is a frequency below the source frequency but above the frequency of high frequency power for controlling plasmas. According to this heterodyne detection method, such a spectrum can be generated around the high frequency signal of the above prescribed frequency, which includes side peaks that can be separated only by an amount of the frequency of the high frequency power for controlling ions, and the filter for selecting high frequency signal with desired frequency from the spectrum can be realized in a simple configuration. With this heterodyne detection method, a high frequency signal of the reflected wave can be captured and output to the power amplifier without error.

For further information the reader is directed to review Japanese laid-open publication No. Hei 9-161994 and Japanese laid-open publication No. 2003-179030.

SUMMARY OF THE INVENTION

The following summary of the invention is provided in order to provide a basic understanding of some aspects and features of the invention. This summary is not an extensive overview of the invention, and as such it is not intended to particularly identify key or critical elements of the invention, or to delineate the scope of the invention. Its sole purpose is to present some concepts of the invention in a simplified form as a prelude to the more detailed description that is presented below.

For semiconductor device manufacturers, the pursuit of miniaturization (high precision) and high performance is continuous. Therefore, there is always a need of a high frequency power supply device which can generate and maintain stable plasma under various conditions. One requirement is to enable rapid reaction to impedance changes in the plasma. An object of the invention is to provide a high frequency power supply device and a high frequency power supplying method which further improved controllability.

According to an aspect of the invention, a novel combination of heterodyne detection and frequency tuning is utilized to ignite and control the plasma. That is, a heterodyne detection is used to extract a signal corresponding to power reflected from the plasma chamber. The signal is used to control frequency tuning and power amplification. In one aspect, once stable plasma is achieved using the frequency tuning, the frequency is fixed and an impedance match circuit is used to couple the RF energy to the plasma chamber.

The high frequency power supply device according to the present invention at least includes a first high frequency power supply block, which supplies a plasma processing chamber with high frequency power at a first frequency, and a second high frequency power supply block, which supplies the plasma processing chamber with high frequency power at a second frequency below the first frequency. The high frequency power supply device is characterized in that the first high frequency power supply block includes: a first high frequency oscillating block, which excites high frequency power at the first frequency and has a variable frequency; a first power amplification block, which receives an output of the first high frequency oscillating block and amplifies power thereof; a first directivity coupler, which receives a reflected wave power from the plasma processing chamber and a traveling wave from the first power amplification block; a first reflected wave heterodyne detection block, which performs heterodyne detection of a reflected wave signal input from the first directivity coupler; and a first control block, which receives a signal after detection of the first reflected wave heterodyne detection block and a traveling wave signal input from the first directivity coupler, and controls an oscillating frequency of the first high frequency oscillating block and an output of the first power amplification block.

With the above configuration, the first control block receives the heterodyne detection signal with a high precision, and can instantaneously optimize the oscillating frequency and the power amplification using an electronic mechanism. Thus, the actual supply of high frequency into the plasma processing chamber can be enabled with a high precision, dependent upon an external operation, and its reaction speed can be improved. That is, in the present invention, although both the first high frequency power supply block and the second high frequency power supply block requires an impedance matching block, the oscillating frequency can be controlled instantaneously using an electronic mechanism to achieve matching before the servo motor mechanism of the impedance matching block is used to control a capacitor, etc. Further, since both an efficiency of high frequency power supplied to plasmas and an output of that high frequency power are optimized instantaneously, the power supplying efficiency of high frequency power can be improved through optimization of the oscillating frequency, as a result, the allowable power capacity of a power element of the power amplification block can be reduced.

In the above semiconductor device fabrication with a high precision, it is especially demanded that a high precision control be performed during low-density plasma. In the case of a low density plasma, however, a primary peak of a reflected wave from the plasma processing chamber may be lowered due to a reduction of supplied power, and a situation of being equal to or lower than the amplitude of a side peak tends to occur. Further, the primary peak of the reflected wave may shift in frequency due to the control on the oscillating frequency described above (i.e., frequency matching). In this case, heterodyne detection can play an effective role through detection of the lower and frequency-deviating primary peak with a high precision. The first control block receives the heterodyne detection signal, and can issue a frequency instruction suitable for matching by the impedance matching block. Thus, the reflected wave can be further weakened. Regardless of this, the first control block can enable the power supply of high frequency power with an optimum oscillating frequency and power amplification in a short time based upon the heterodyne detection signal of the weakened reflected wave. In semiconductor device fabrication with a high precision, it is crucial to improve controllability (a follow-up reaction speed, precision, and resultant stability) of various plasmas and especially high controllability in a status of a low density plasma. Semiconductor device fabrication with a high precision can be enabled ideally through application of the present inventive heterodyne detection and frequency control.

Further, it is of course that a reliability of a detection signal can be improved through detection of a reflected wave using heterodyne detection, and therefore the oscillating frequency and the output can be controlled merely depending upon the detection signal. Consequently, for example, no additional detection device (plasma generation detection means and the like) will be required. Moreover, a traveling wave signal can be input directly to the first control block from the first directivity coupler, and also can be input to the first control block through the first traveling wave detection block of the filter, etc.

Further, such a configuration can be provided in which the first high frequency power supply block may include a first traveling wave heterodyne detection block, which performs heterodyne detection of a traveling wave signal from the first directivity coupler, and the first control block receives a heterodyne detection signal of the traveling wave signal. With such a configuration, even if the traveling wave signal from the first directivity coupler is mixed with a frequency-modulated wave or a high order harmonics, which may become noise and therefore influence the control, the traveling wave signal can still be detected with a high precision, and the control on power amplification can be enabled with a high precision.

Further, the second high frequency power supply block may include: a second high frequency oscillating block, which excites high frequency power at the second frequency and has a variable frequency; a second power amplification block, which receives an output of the second high frequency oscillating block and amplifies power thereof; a second directivity coupler, which inputs a reflected wave from the plasma processing chamber and a traveling wave from the second power amplification block; a second reflected wave detection block, which detects a reflected wave signal input from the second directivity coupler; and a second control block, which receives a signal after detection of the second reflected wave detection block and receives a traveling wave signal from the second directivity coupler, and controls an oscillating frequency of the second high frequency oscillating block and an output of the second power amplification block. Thus, in the case that the plasma processing chamber is supplied with first high frequency power, and is supplied with high frequency power for controlling ions, which controls the bombardment of ions on the substrate, as the second high frequency power, a frequency and a power value of the second high frequency power can be optimized instantaneously with a high precision using an electronic mechanism before the control using the servo motor mechanism of the impedance match block, thereby improving stability of plasmas. It is required that plasma be in an electronically neutral condition within an object range. And once their equilibrium is broken, some instability factors may occur. However, with the above configuration enabling a control on the second high frequency power supply block, plasmas (a plasma density, a plasma pressure, a plasma temperature, etc.) can be controlled in a short response time with a high precision. Further in the case of the second frequency being low, no heterodyne detection is required for a reflected wave at the second frequency, which can be detected with a high precision using a filter with a simple configuration, thereby enabling the frequency control. Further, a frequency of using the servo motor mechanism of the impedance matching block configured for the second high frequency power supply block can be lowered with the above frequency control. As in the first high frequency power supply block, an allowable power capacity of a power element of the second power amplification block can also be reduced. Moreover, a traveling wave signal can be input directly to the second control block from the second directivity coupler, and also can be input to the first control block through the second traveling wave detection block of the filter, etc.

Further, such a configuration can be provided in which the second reflected wave detection block may act as a second reflected wave heterodyne detection block, which performs heterodyne detection of the reflected wave signal, and the second control block receives a signal after detection in the second reflected wave heterodyne detection block and controls an oscillating frequency of the second high frequency oscillating block and an output of the second power amplification block. With such a configuration, in the case of further increasing the frequency of the first high frequency power supply block and accordingly the frequency of the second high frequency power supply block, a reflected wave signal with a high precision can be received through additional heterodyne detection of a reflected wave in the second high frequency power supply block, thereby supplying efficiently and instantaneously the plasma processing chamber with the second high frequency power necessary for stable maintenance of plasmas.

Further, such a configuration can be provided in which the second high frequency power supply block may include a second traveling wave heterodyne detection block, which performs heterodyne detection of a traveling wave signal from the second directivity coupler, and the second control block receives a heterodyne detection signal of the traveling wave signal. With such a configuration, in the case of further increasing the frequency of the first high frequency power supply block and accordingly the frequency of the second high frequency power supply block, even if a frequency-modulated wave and/or its higher order harmonics are mixed in a traveling wave signal of the second high frequency power supply block, the traveling wave signal of the second high frequency power supply block can be detected with a high precision through heterodyne detection of the traveling signal, thereby improving an output precision of the power amplification.

Further, there can be further provided one or more high frequency power supply blocks, which supply the plasma processing chamber with high frequency power and output high frequency power at a frequency different from the first and second frequencies. With such a configuration, the supply of high frequency power can be enabled with a higher precision, which will contribute to semiconductor device fabrication with a high precision.

Further, at least one of the one or more high frequency power supply blocks may include: a heterodyne detection block, which performs heterodyne detection of at least a reflected wave signal of the reflected wave signal and a traveling wave signal; and a control block, which receives the reflected wave signal after detection of the heterodyne detection block and controls an oscillating frequency and an output of the high frequency power supply block. With such a configuration, the supply of high frequency power to the plasma processing chamber can be made more precise, thereby improving instantaneous responsiveness and precision of the control.

The inventive method of the present invention is a high frequency power supplying method that supplies a plasma processing chamber at least with a first high frequency power at a first frequency and a second high frequency power at a second frequency below the first frequency. The method is characterized by including: a process of amplifying the first high frequency power in a first high frequency power supply block, and amplifying the second high frequency power in a second high frequency power supply block, and supplying those powers to the plasma processing chamber; a process of performing, in the first high frequency power supply block, heterodyne detection of a reflected wave from the plasma processing chamber; a process of receiving a reflected wave signal after heterodyne detection and a traveling wave signal of the first high frequency power, and controlling an oscillating frequency and power amplification of the first high frequency power supply block; a process of detecting, in the second high frequency power supply block, a reflected wave from the plasma processing chamber and a traveling wave of the second high frequency power; and a process of receiving a reflected wave signal and a traveling wave signal after detection, and controlling an oscillating frequency and power amplification of the second high frequency power supply block.

According to the above method, in the first high frequency power supply block, the heterodyne detection signal of the reflected wave is used as a control signal for being fed back to the power amplifier and for impedance matching, and the following processes are performed simultaneously: the servo motor mechanism is used to achieve matching in the impedance match block; prior to the matching by the servo motor mechanism, an electronic mechanism can be used to optimize an oscillating frequency and a high frequency power value instantaneously with a high precision. Furthermore, in the second high frequency power supply block, an electronic mechanism can also be used to optimize both an oscillating frequency and a high frequency power value instantaneously with a high precision. Thus, a fluctuation of plasmas (a plasma density, a plasma pressure, a plasma temperature, etc.) can be dealt with a higher precision than ever before, thereby supplying instantaneously optimum high frequency power. This high frequency power supplying method is effective on stable generation of various types of plasmas, and especially, a reflected wave from the processing chamber during ignition of plasmas with a low density can be received with a high precision using heterodyne detection, and the optimum power amplification and oscillating frequency can be attained instantaneously. Due to an improved efficiency of supplying high frequency power and greatly inhibited necessary power amplification, power amplification of lower rating may be utilized.

The inventive high frequency power supply device and high frequency power supplying method can enable a control on supplying high frequency power effective in generation of various plasmas with a high precision instantaneously. It is possible to improve controllability (a follow-up reaction speed, a precision, and a resultant stability) of supplying high frequency power to various types of plasmas, and especially it is possible to improve controllability of supplying high frequency power in plasmas with a low density, which is thus effective on miniaturization (densification) of a semiconductor device.

BRIEF DESCRIPTIONS OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not necessarily drawn to scale.

DETAILED DESCRIPTIONS OF THE EMBODIMENTS

A First Embodiment

Figure 1:
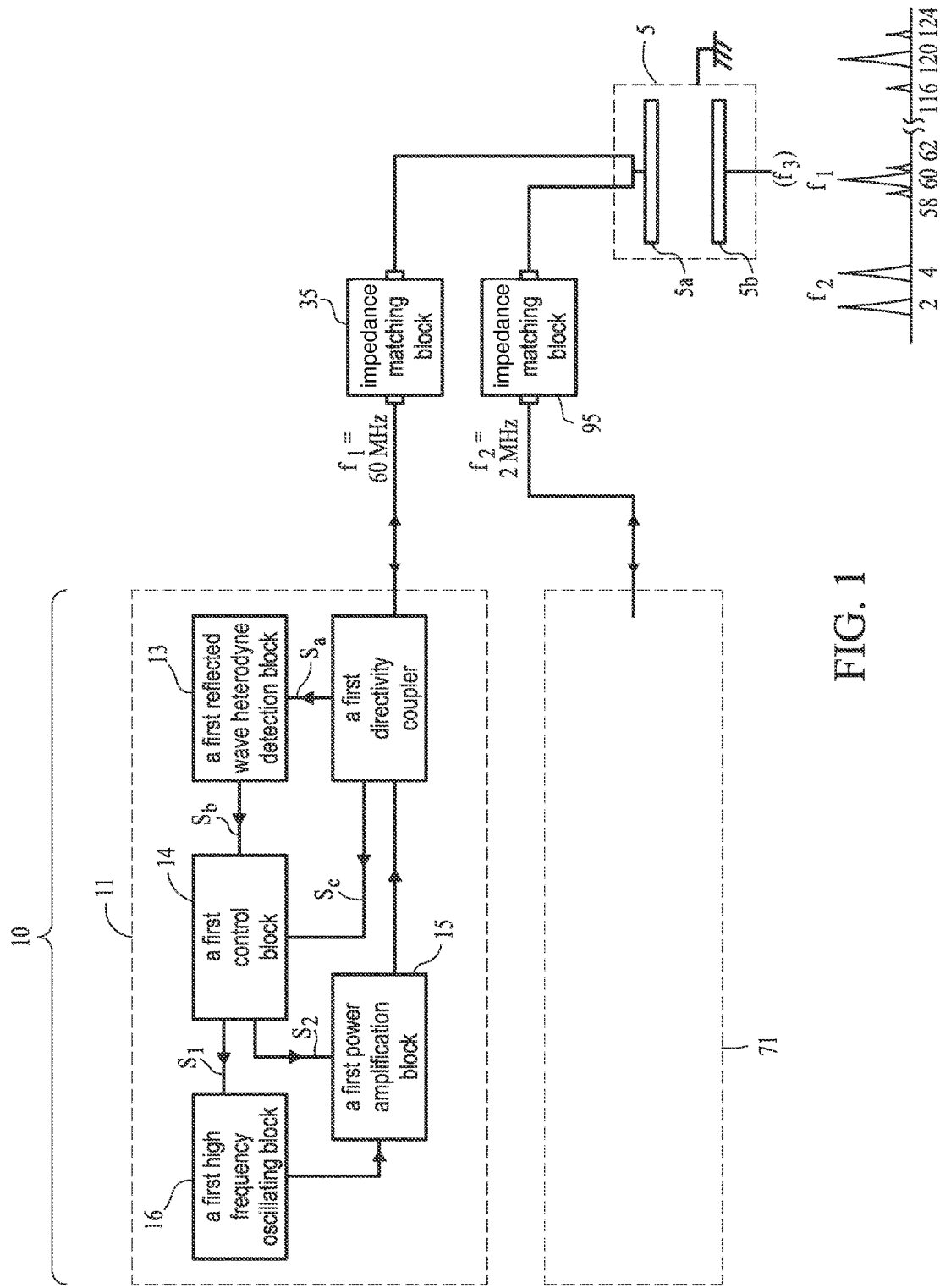
FIG. 1 is a block diagram depicting a high frequency power supply device according to a first embodiment of the invention.

FIG. 1 is a block diagram depicting a high frequency power supply device 10 according to the first embodiment of the invention. In FIG. 1, high frequency power at a first frequency f1 is supplied from a first high frequency power supply block 11 to a plasma processing chamber 5, and high frequency power at a second frequency f2, lower than the first frequency f1, is supplied from a second high frequency power supply block 71 to the plasma processing chamber 5. In FIG. 1, although the plasma processing chamber 5 is illustrated as a plasma processing chamber provided with parallel flat plates, an electrode plate 5a and an electrode plate 5b, any other apparatus form may be used, provided that it is a processing chamber which is supplied with high frequency power to generate plasmas. Further in FIG. 1, although a substrate to be plasma-processed (e.g., a semiconductor wafer) is mounted on the electrode plate 5b, it also can be mounted on the electrode plate 5a. High frequency power at the first frequency causes a high frequency electrical field to be formed between the two parallel flat plates 5a and 5b, as gas is injected thereinto to generate plasma. Further, high frequency power at the second frequency is high frequency power for controlling ion energy, which is supplied to control a motion of ions around the electrode plates. Although the first frequency f1 is set around 60 MHz (which is controlled by a first control block 14, and varies within a prescribed range), and the second frequency f2 is set around 2 MHz, the first and second frequencies can be higher or lower. Exemplary values for f1 include 13.56 MHz, 24 MHz, 60 MHz, 100 Mhz, and 160 Mhz. In this embodiment, the second frequency can be varied arbitrarily, but is normally kept below about 10 MHz, more specifically at or below about 2.2 MHz. Further in FIG. 1, although there is depicted that the electrode plate is connected to a high frequency power supply block (not shown) at a frequency f3, a direct current power supply block (thus f3=0) or a high frequency power supply block can also be connected. Thus, a tri-frequency synthesized high frequency power supply device can be configured. However, a dual-frequency synthesized high frequency power supply device of the first and second frequencies is also possible without the high frequency power supply block at the frequency f3. Regardless of the configuration used, a bias DC potential may be applied to cathode 5b so as to chuck the substrate.

The first high frequency power supply block 11 includes a first high frequency oscillating block 16 (e.g., an RF source), which excites the high frequency power at the first frequency f1. The oscillating block 16 is variable frequency RF source. The supply block 11 further includes a first power amplification block 15, which amplifies the high frequency power excited by the first high frequency oscillating block 16, and further includes a first control block 14, which controls the oscillating frequency of the first high frequency oscillating block 16 and the amplification ratio of the first power amplification block 15. A first heterodyne detection block 13 is adapted to separate a reflected wave signal from the plasma processing chamber 5, to mix the signal with a signal at a prescribed frequency excited from a local oscillator (not shown), and to convert the signals into a low frequency for detection. The first heterodyne detection block 13 will be referred to as "a first reflected wave heterodyne detection block" for distinguishing from "a first traveling wave heterodyne detection block" for heterodyne detection of a traveling wave signal to be described later, and although depicted, "reflected wave" will be omitted in the case of an intricacy, thus simply referred to as "the first heterodyne detection block 13".

Through the first directivity coupler 12, a reflected wave Sa mixed by the high frequency at the first frequency f1 and the high frequency at the second frequency f2 is input to the first heterodyne detection block 13, and is converted into a low frequency through heterodyne detection. Thus, a signal Sb selected by a band pass filter can be output. A detailed configuration of the first heterodyne detection block 13 will be described later. The first control block 14 receives the reflected signal Sb after heterodyne detection and a traveling wave (incident wave) signal Sc from the first directivity coupler 12. A calculation is performed based upon these received signals Sb and Sc, so that a frequency control signal S1 is issued to the first high frequency oscillating block 16, and an output control signal S2 is issued to the first power amplification block 15. The incident wave (traveling wave) is input from the first power amplification block 15 to the first directivity coupler 12, and the incident wave signal Sc is input to the first control block 14 as described above.

Separately from the first high frequency power supply block 11, there is provided a second high frequency power supply block 71 for controlling ion energies. The second high frequency power supply block 71 includes a high frequency exciter (not shown), but in this embodiment, an oscillating frequency can be variable or fixed. For instance, it can also perform a control on an amplification ratio of a power amplifier as prior high frequency power supply devices, and an impedance match block can be used for another control to achieve matching. That is, since the power supply block 71 is used to control ion energy and not for igniting and maintaining the plasma, the reaction time of the impedance matching for the power supply block 71 is not critical. Therefore, the power supply block 71 may be constructed using prior art technology, or using a similar arrangement as for the power supply block 11.

The first frequency power supply block 11 and the second frequency power supply block 71 are connected to the upper electrode 5a of the plasma processing chamber 5, respectively, via impedance match blocks 35 and 95. Since the first frequency power supply block 11 can control instantaneously an oscillating frequency to inhibit the strength of a reflected wave, therefore a servo motor control mechanism of the impedance match block 35 may or may not be provided between the plasma processing chamber 5 and the first high frequency power supply block 11. Frequency-modulated waves and high order harmonics of high frequency power at the first and second frequencies are generated in the plasma processing chamber 5, a part of a spectrum thereof is depicted in association with the plasma processing chamber 5 in FIG. 1. The spectrum is generated which includes a primary peak of the first frequency f1, a side peak resulting from a frequency-modulated wave deviating a few wavelengths from and around the first frequency f1, a primary peak of the second frequency f2, and their high order harmonics.

Figure 2:
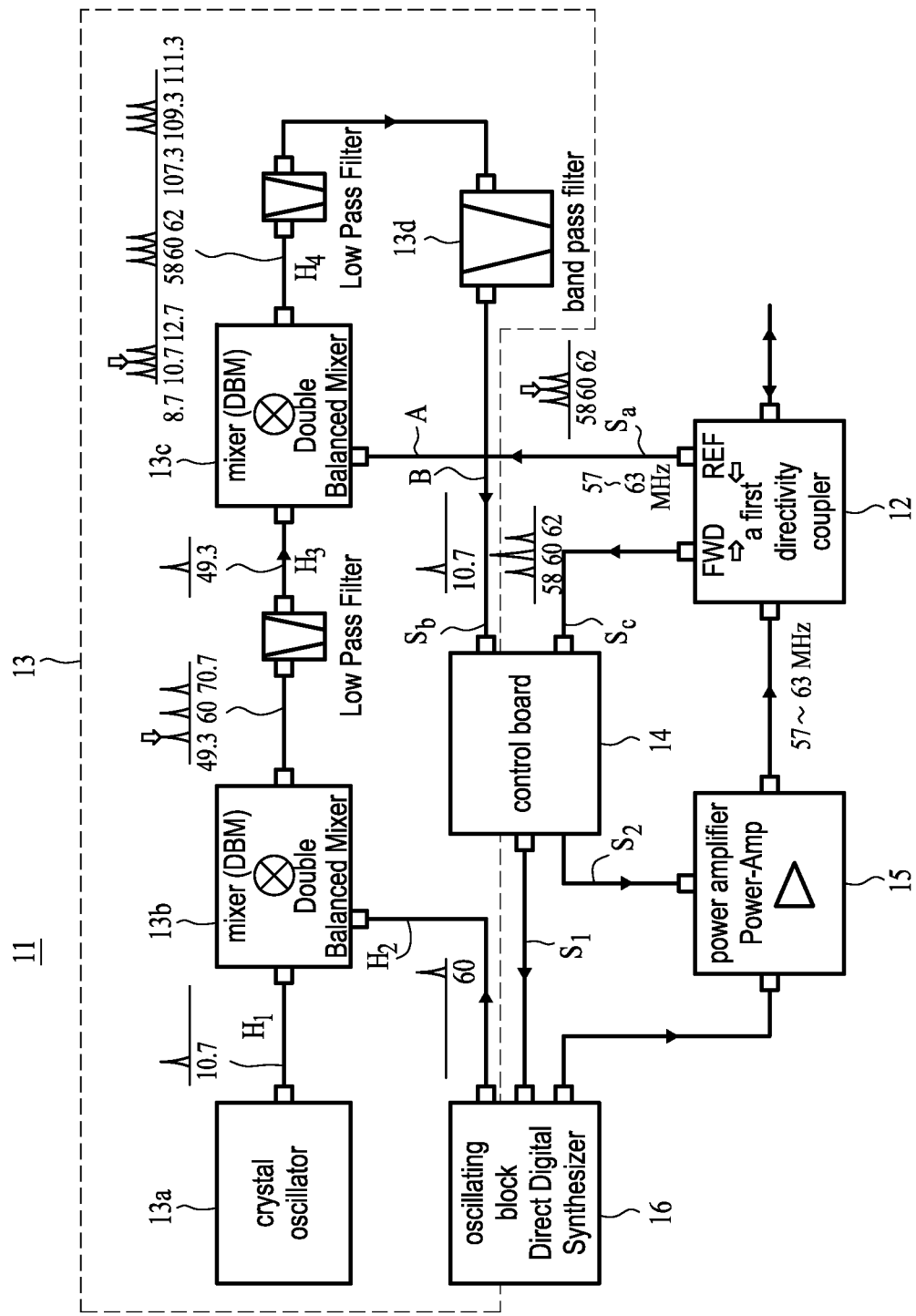
FIG. 2 is a block diagram depicting a first high frequency power supply block of the high frequency power supply device in FIG. 1.

The first high frequency power supply block 11 will be described hereinafter focusing on the first heterodyne detection block 13 with reference to FIG. 2. In FIG. 2, a crystal exciter 13a outputs a signal H1 at a frequency fm (=10.7 MHz), which is mixed at a mixer (DBM: Double Balanced Mixer) 13b with a signal H2 at the frequency f1 (=60 MHz) excited by an exciter (the first high frequency oscillating block) 16 to generate a signal at frequencies of 49.3 MHz, 60.7 MHz, and 70.3 MHz. A signal component at the frequency of 49.3 MHz is extracted therefrom through a low pass filter, and is output as H3. This signal H3 and a reflected wave signal Sa from the plasma processing chamber 5, which is separated by the first directivity coupler 12, are input to a mixer (DBM) 13c, and a synthesized signal H4 is output from the mixer 13c. The synthesized signal H4 includes a spectrum with side peaks of 8.7 MHz and 12.7 MHz around a primary peak of 10.7 MHz, and information of the reflected wave Sa is reflected in the primary peak of 10.7 MHz. The crystal exciter 13a, the mixer 13b, the low pass filter, the mixer 13c, the band pass filter 13d, and a part of the oscillating block 16 constitute the first heterodyne detection block 13.

So-called heterodyne detection refers to that a high frequency signal at frequencies f1±fm (f1>fm>f2) are generated by adding to and subtracting a prescribed frequency fm (of 10.7 MHz in the case of FIG. 2) from the high frequency signal at the first frequency f1 and the signal at f1+fm (a sum component) or f1−fm (a difference component) is extracted and mixed with the reflected wave to be converted into a spectrum for detection, which includes side peaks around the frequency fm. In FIG. 2, there is depicted a case that the difference component f1−fm is extracted for use, although the sum component f1+fm can also be used. The spectrum after conversion has a frequency ratio (fm/f2) becoming less and approximately 5 (=10.7/2), so that a filter separating the primary peak (the frequency fm) from the side peaks can be made with a simple configuration. Based upon the primary peak at the frequency fm (10.7 MHz), the oscillating frequency and the power amplification ratio can be controlled.

As noted above, the primary peak selected by the band pass filter 13d with a simple configuration is a signal Sb. After the first control block (a control board) 14 receives and performs calculation on the detection signal and the incident wave signal Sc from the first directivity coupler 12, the frequency control signal S1 is input to the first high frequency oscillating block (the oscillating block) 16, and the output control signal S2 is input to the power amplifier (the first power amplification block) 15, respectively. Further, the type of supplying the first high frequency power (a level of 60 MHz) and the second high frequency power (a level of 2 MHz) has been described with respect to the supply of high frequency power to the plasma processing chamber, but a tri-frequency synthesis can also be adopted in which direct current or high frequency power (referred to the third high frequency power) is supplied simultaneously in addition to the first high frequency power and the second high frequency power. Still further, a quad-frequency synthesis type simultaneously supplying four frequencies is also possible. Moreover, at least, heterodyne detection can be performed on a reflected wave signal, and a control can be performed on an oscillating frequency and an output, with respect to detection of the tri-frequency synthesis type in addition to the dual-frequency synthesis type. Further, heterodyne detection can be performed on a traveling wave, and a control can be performed on an oscillating frequency and an output, as described below.

The detection signal Sb after heterodyne output varies according to the following changeable statuses, for example: a change of a gas type or a gas pressure of plasmas or a sharp change of a load impedance (plasmas) immediately after etched holes reach an under-layer of different material. The control board (the first control block) 14 can respond to a variation of the detection signal Sb, so that both the oscillating frequency and the power amplification ratio of the oscillating block (the first high frequency oscillating block) are optimized immediately.

Therefore, as compared with previous approach (the first conventional approach) in which plasmas are excited at a fixed frequency immediately after generation of plasmas, and matching is achieved dependent upon an impedance matcher during generation of plasmas, a change occurring in plasma processing (e.g., a change in a plasma density, a plasma pressure, a plasma temperature, etc.) can be dealt rapidly with a high precision. Further, as compared with another previous approach (the second conventional approach) in which a heterodyne detection signal is used to control a power amplifier, and matching is achieved dependent upon a servo motor mechanism of an impedance matcher, an abrupt change of a plasma status can be dealt within a short time.

As a result of improved responsiveness to a change in a plasma status during processing, since controllability (a responding speed, a precision, a plasma stabilizing operation) of plasmas (a plasma density, a plasma pressure, a plasma temperature, etc.) is improved with the inventive high frequency power supply device and high frequency power supplying method, contact holes or trenches or the like with a high aspect of a semiconductor device can be disposed stably with a high precision. Especially since high controllability can be achieved for high frequency power supplied to plasmas with a low plasma density, it is very advantageous to semiconductor device fabrication with a high precision.

In the first high frequency power supply block 11 of this embodiment, the first control block 14 optimizes both the oscillating frequency and power amplification, and therefore achieves impedance matching instantaneously through a frequency control. Due to reduction of a desired power amplification ratio, an allowable power capacity of the power amplifier can be reduced, thereby cutting down a cost of the power amplification means. Further, since a frequency of driving the servo motor mechanism of the impedance match block 35 is lowered, a lifetime of a vacuum variable capacitor driven by the servo motor mechanism can be extended. Further, the servo motor mechanism can be removed from the impedance match block 35 in some cases, which is effective to cut down the cost. Moreover, the servo motor mechanism of the impedance match block 35 can also be preconfigured. Further, a capacity of the power amplification means may not necessarily be made particularly small.

Figure 3:
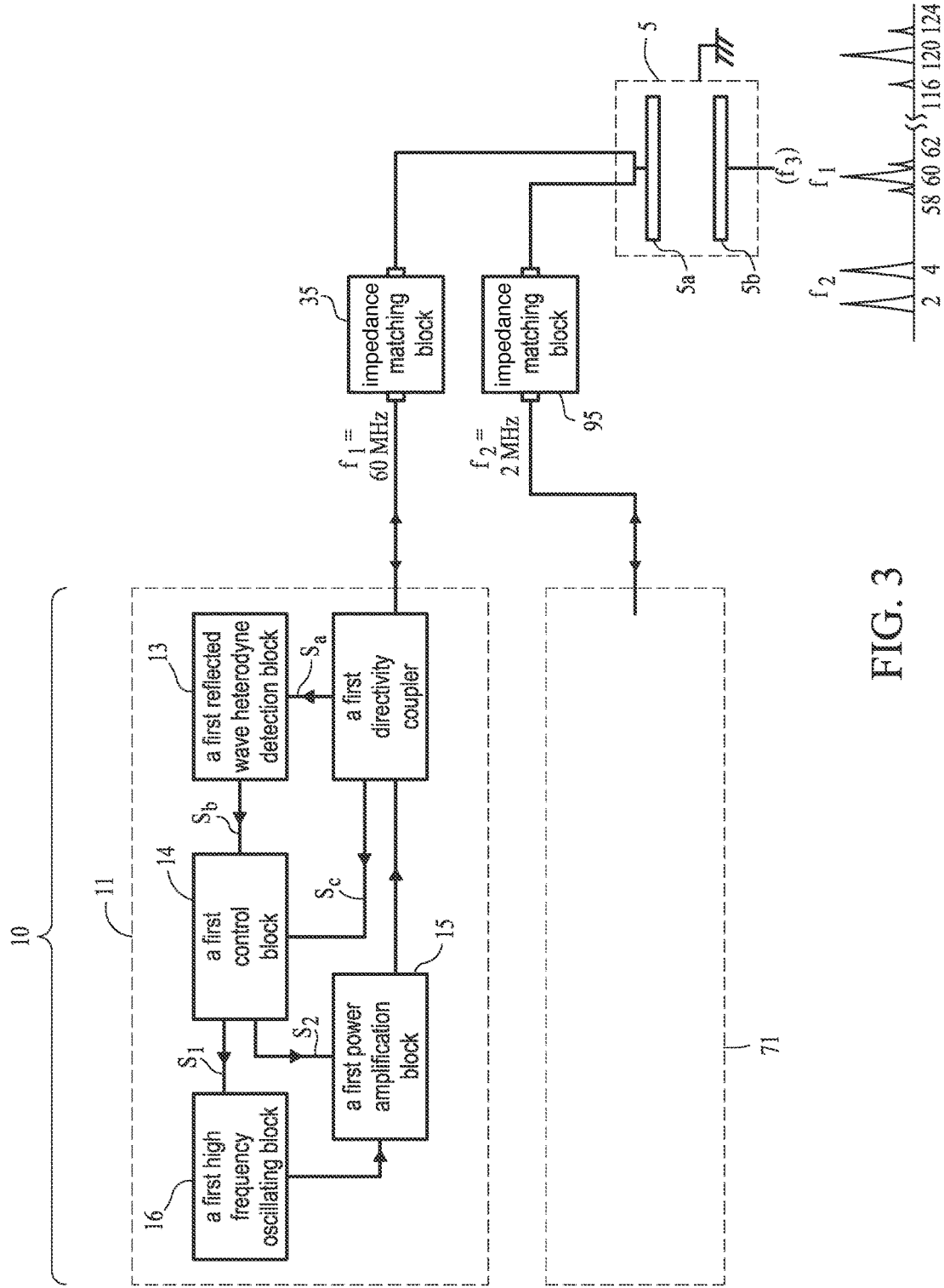
FIG. 3 is a block diagram depicting a variation of the high frequency power supply device according to the first embodiment of the invention.
Figure 4:
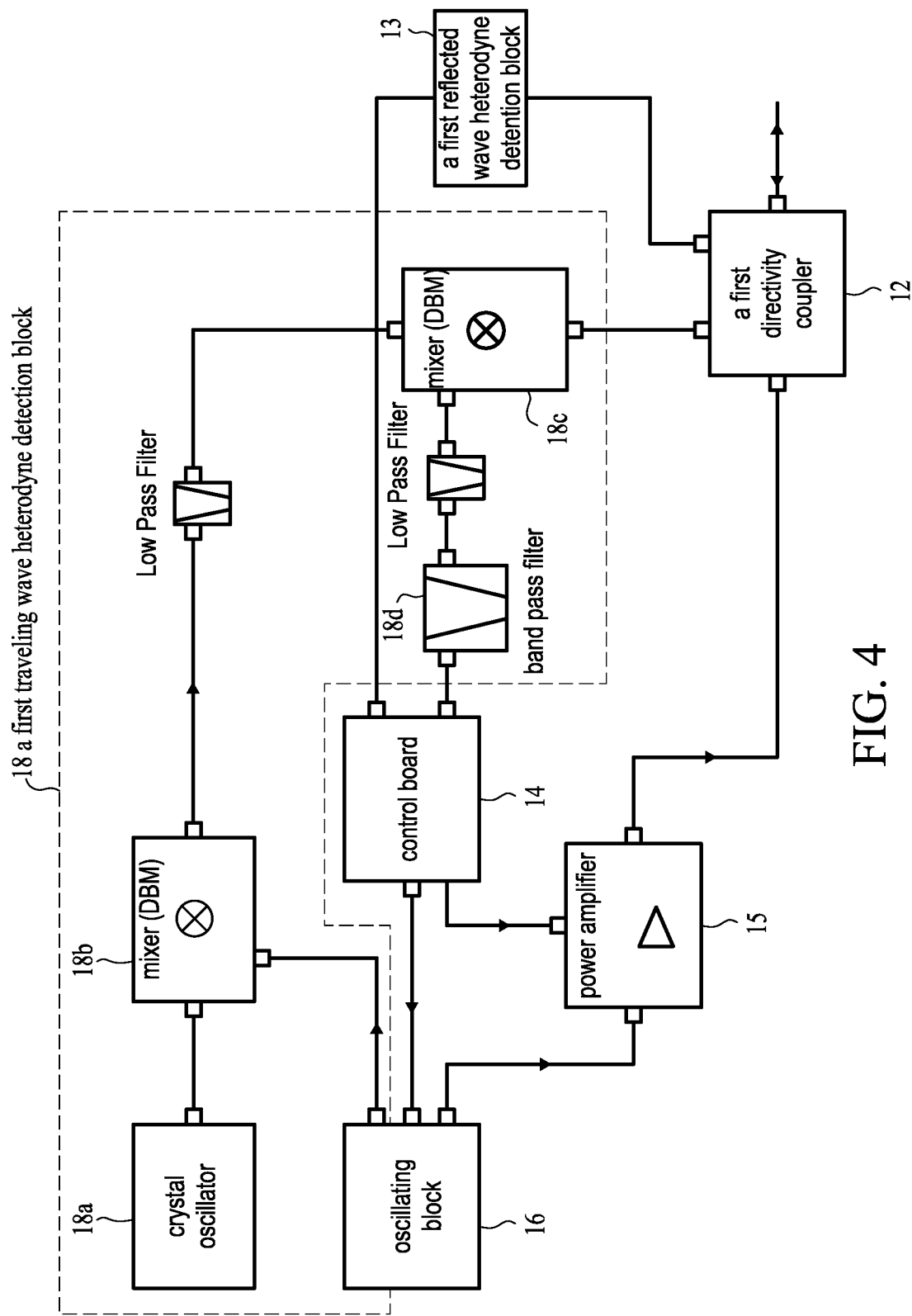
FIG. 4 is a block diagram depicting a first traveling wave heterodyne detection block of a first high frequency power supply block of the high frequency power supply device in FIG. 3.

FIG. 3 and FIG. 4 are diagrams depicting an example of a first traveling wave heterodyne detection block 18 which is provided to perform heterodyne detection of a traveling wave signal in addition to a reflected wave signal in the embodiment. The first traveling wave heterodyne detection block 18 is configured as FIG. 4 in the same way as in the first reflected wave heterodyne detection block 13 in FIG. 2, and is configured with a mixer 18b which mixes a high frequency signal from the oscillating block 16 with a signal from a crystal exciter 18a, and a mixer 18c which mixes a signal from the mixer 18b with a traveling wave signal from the first directivity coupler 12. With such mixing, peaks at low frequencies can be obtained, and the traveling wave signal can be detected with a high precision using a simply configured band pass filter 18d. As a result, even in a case that a high order harmonic or a frequency-modulated wave is mixed in a traveling wave, a value of power of the traveling wave can be grasped actually, and a control can be performed on a power amplification ratio properly. Further, also as illustrated at a frequency f3 in FIG. 3, direct current or high frequency power (the third high frequency power) is supplied simultaneously to an electrode plate 5b of the plasma processing chamber. Thus, a tri-frequency synthesized high frequency power supply device can be configured. Further, a quad-frequency synthesized device can be configured with supplying simultaneously high frequency power at other frequencies. With respect to detection for the synthesized devices with three frequencies or more frequencies, at least, heterodyne detection can be performed on a reflected wave signal, and can be used to control an oscillating frequency and output. Moreover, also heterodyne detection can be performed on a traveling wave signal, and can be used to control an oscillating frequency and output.

A Second Embodiment

Figure 5:
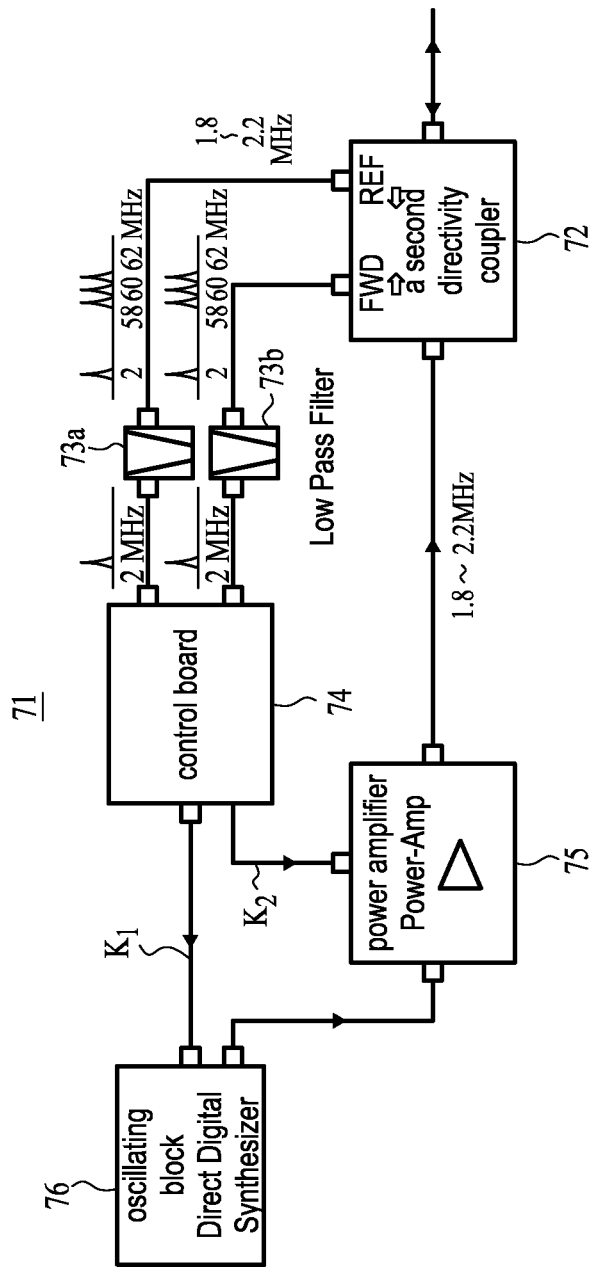
FIG. 5 is a block diagram depicting a second high frequency power supply block of a high frequency power supply device according to a second embodiment of the invention.

FIG. 5 is a block diagram depicting a second high frequency power supply block 71 used in a high frequency power supply device according to the second embodiment of the invention. In a first high frequency power supply block supplying high frequency for generation of plasmas, the same device is used as in the first embodiment. In the first embodiment, any high frequency power supply is possible provided that the high frequency power supply block 71 for controlling ions can supply high frequency power at a frequency below the first frequency. However this embodiment is characterized in that there is provided a control board (a second control block) 74, which controls an oscillating frequency of an oscillating block (a second high frequency oscillating block) 76 of the high frequency power supply block for controlling ions and an output of a power amplifier (a second power amplification block) 75, and which inputs a frequency control signal K1 and an output control signal K2 to the oscillating block 76 and the power amplifier 75, respectively. High frequency power for controlling ion energies is used to control ion injection in plasmas. Plasmas are maintained in an electronically neutral condition, and injection of ions is necessary for maintaining an electronically neutral condition. Absence of the ion control may result in increased instability. Thus, the control on the supply of the second high frequency power for controlling ions is crucial for stable maintenance of plasmas (an ion energy, a plasma pressure, a plasma temperature, etc.).

In FIG. 5, high frequency power at the lower second frequency (e.g., 2 MHz) for controlling ions is amplified at the second power amplifier 75, and is supplied to the plasma processing chamber via the impedance match block 95 (see FIG. 1 and FIG. 3) through a second directivity coupler 72. A reflected wave from the plasma processing chamber is separated at the second directivity coupler 72, and is input to the control board (the second control block) 74 through a low frequency band filter 73a. The reflected wave from the plasma processing chamber includes the spectrum of the individual peak at the lower second frequency, and a spectrum consisted of a primary peak at the higher first frequency (e.g., 60 MHz) supplied by the first high frequency power supply block and a side peak at an interval of the second frequency. A low frequency band filter, which selects the individual peak at the second frequency from this signal, can be made with a simple configuration. A second detection block for detecting a reflected wave is constituted by the low frequency band filter 73a. A signal of the selected individual peak of the reflected wave is input to the control board (the second control block) 74.

A signal along a path of traveling wave power through the second directivity coupler 72 is formed of the same spectrum as that of the reflected wave. An individual peak at the lower frequency is selected simply with a low pass filter 73b, and a signal of the individual peak of a traveling wave (incident wave) is input to the control board (the second control block) 74. The control board 74 performs calculation on the reflected wave signal and the traveling wave signal, and inputs the frequency control signal K1 to the oscillating block (the second high frequency oscillating block) 76, and the output control signal K2 to the power amplifier (the second power amplification block) 75, respectively.

With the above configuration, dependent upon a change of a plasma status (an ion energy, a plasma pressure, a plasma temperature, etc.), high frequency power for controlling ion energies, which is supplied to control ion energies near an electrode plate in plasmas can be controlled correspondingly to an optimum frequency and an optimal power value instantaneously. With the above configuration, a plasma status can be controlled correspondingly to keep stable through improving a follow-up speed and precision of controlling ion energies near an electrode plate, even if numerous instability factors are present in plasma processing.

Further, a frequency of using a servo motor mechanism of an impedance match block configured for the second high frequency power supply block is lowered due to the frequency control. Therefore, a lifetime of a vacuum variable capacitor driven by the servo motor mechanism can be lengthened, and even the servo motor mechanism can be omitted in some cases. Further, an allowable power capacity of the second power amplifier can be reduced as in the first high frequency power supply.

Figure 6:
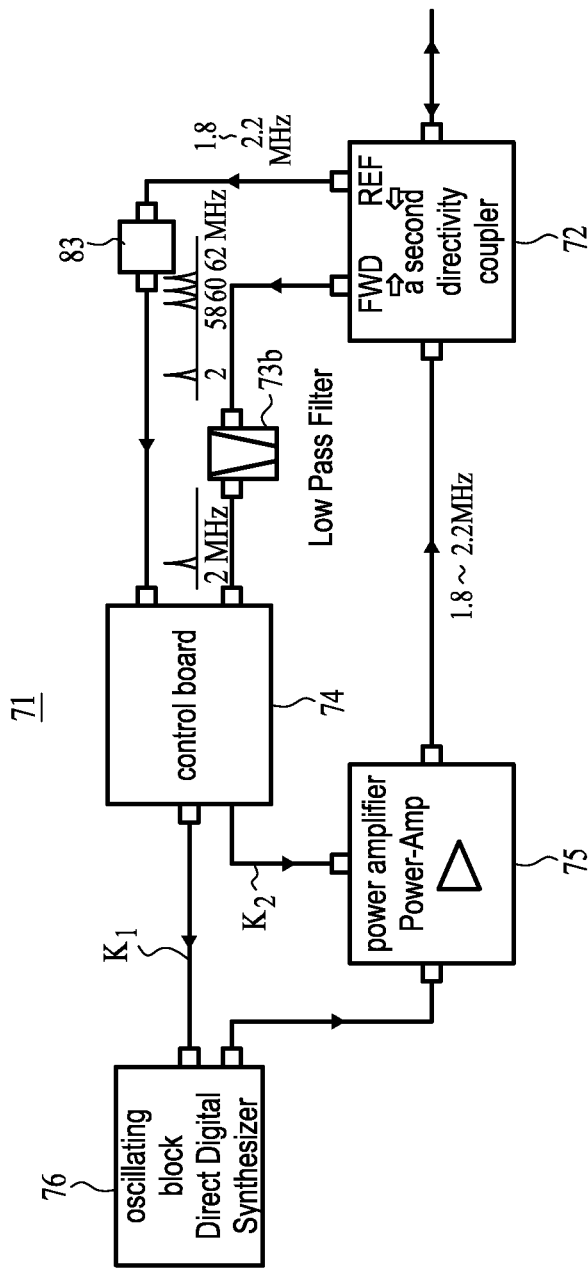
FIG. 6 is a block diagram depicting a variation of the second high frequency power supply block of the high frequency power supply device according to the second embodiment of the invention.
Figure 7:
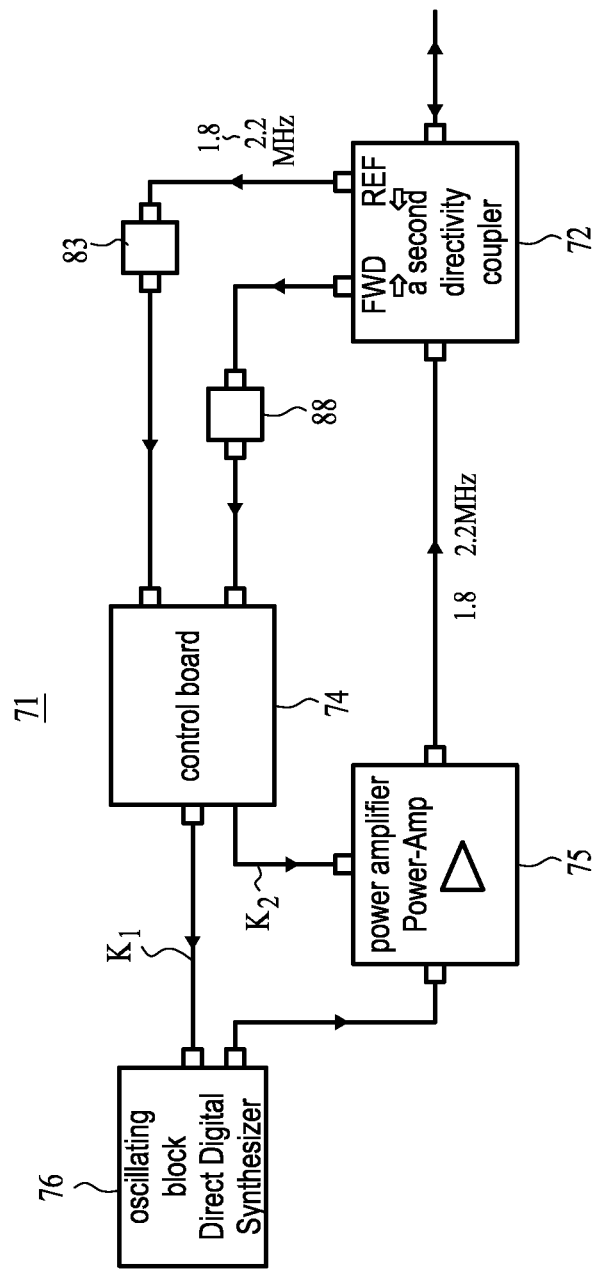
FIG. 7 is a block diagram depicting another variation of the second high frequency power supply block of the high frequency power supply device according to the second embodiment of the invention.

Reflected wave power in FIG. 5 has a frequency of 1.8 MHz-2.2 MHz, and therefore detection can be performed with a high precision using the low frequency band filter 73a. However, in the case that an oscillating frequency of the first high frequency power supply block becomes higher, and the frequency of the second high frequency power for controlling ions also reaches tens of MHz, for example, detection can not be performed with a high precision only using the low frequency bandpass filter 73a. As a result, a situation may occur in which a control is performed improperly based upon an incorrect reflected wave signal. In the case of a higher frequency of the second high frequency power, it is preferable that heterodyne detection be performed also in the second high frequency power supply block 71. FIG. 6 is a diagram depicting a configuration of the second high frequency power supply block 71 configured with a second reflected wave heterodyne detection block 83, which performs heterodyne detection of a reflected wave signal from the second directivity coupler 72. As such, a reflected wave can be detected with a high precision through performing heterodyne detection of the reflected wave signal in the second high frequency power supply block 71, and based upon the heterodyne detection signal, the supply of the second high frequency power can be optimized instantaneously, and the ion control necessary for stabilizing plasmas can be performed with a high precision. Further, through performing heterodyne detection also on a traveling wave signal from the second directivity coupler 72, as illustrated in FIG. 7, instead of only on a reflected wave signal (see FIG. 6), an output of the power amplifier in the second high frequency power supply block 71 can be controlled properly with a higher precision.

EXAMPLES

Figure 8:
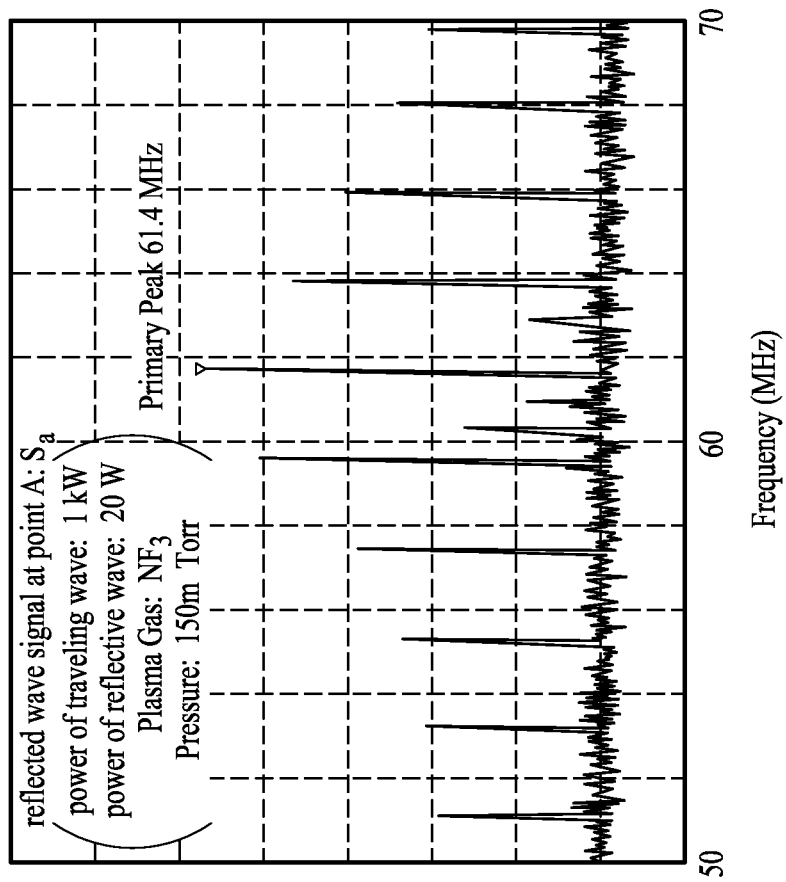
FIG. 8 is a diagram depicting a frequency spectrum of a reflected wave signal before heterodyne detection (at a pressure of 150 mTorr).
Figure 9:
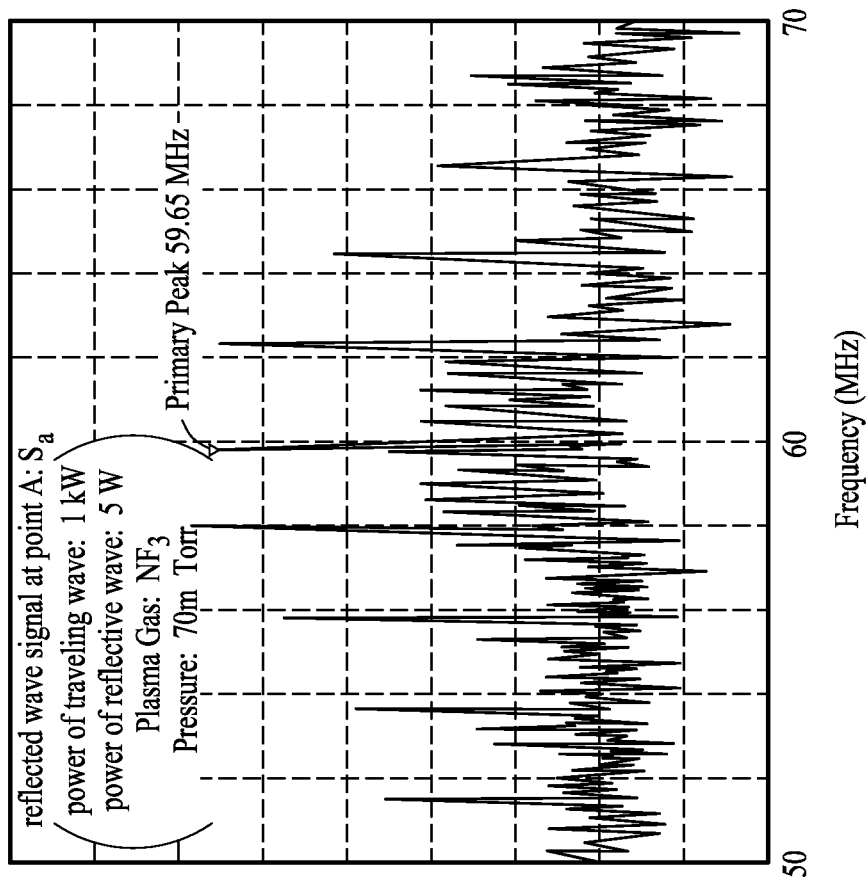
FIG. 9 is a diagram depicting a frequency spectrum of a reflected wave signal before heterodyne detection (at a pressure of 70 mTorr).

Hereinafter, there will be depicted a result obtained from measuring a frequency spectrum of a reflected wave signal at a point A (a signal Sa) and a point B (a signal Sb) of the first high frequency power supply block (see FIG. 1 and FIG. 2) by using the first high frequency power supply block 11 as illustrated in FIG. 2, and the second high frequency power supply block 71 as illustrated in FIG. 3. FIG. 8 is a diagram depicting a frequency spectrum of a reflected wave signal when NF3 is used in a plasma gas at a pressure of 150 mTorr with traveling wave power of 1 kW. Reflected wave power is 20 W at the point A prior to heterodyne detection. At this time, a primary peak of the reflected wave is at 61.4 MHz and has a magnitude higher than those of side peaks deviating by approximately 2 MHz, but is difficult to be separated from the side peaks and thus taken in. In the prior art, the reflected wave signal in this status was applied to a feedback in power amplification, and therefore the side peaks might also be incorporated, and an incorrect reflected wave signal might thus be received. Further, FIG. 9 is again a diagram depicting a frequency spectrum of a reflected wave signal at the point A but with a lower plasma pressure of 70 mTorr. At this time, a primary peak is at 59.65 MHz and has a magnitude equal to or slightly lower than that of the side peak. A relatively low plasma pressure is crucial in a plasma processing for micro-fabrication of semiconductor devices, but since the magnitude of the primary peak becomes low, an error of the reflected wave signal will occur readily, and an improper control tends to occur.

Figure 10:
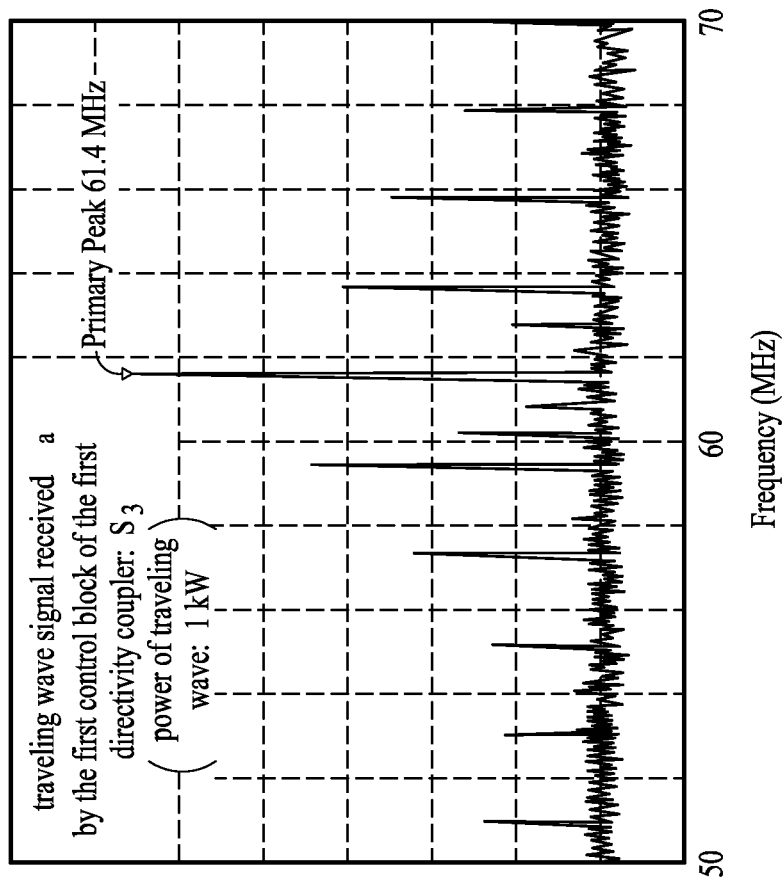
FIG. 10 is a diagram depicting a frequency spectrum of a traveling wave signal before heterodyne detection.

Further, FIG. 10 depicts a spectrum of the traveling wave signal Sc received by the first control block 14 from the first directivity coupler 12 in FIG. 1. Since the traveling wave and the reflected wave from the first directivity coupler 12 are not separated sufficiently, the traveling wave signal Sc overlaps with the reflected wave signal and may include side peaks identical to the reflected wave signal Sa. However, since unlike the reflected wave signal Sa, the strength of the primary peak is relatively higher than that of the side peaks, a significant error may not occur readily in detection, but the strength of the primary peak is not so high that an influence of the side peaks can be ignored.

Figure 11:
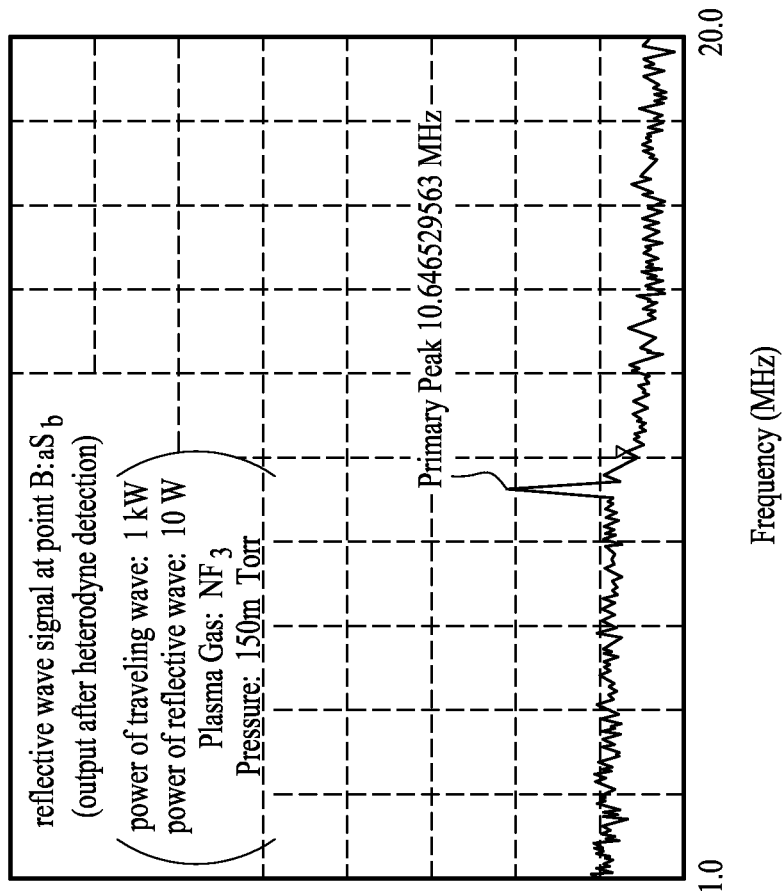
FIG. 11 is a diagram depicting a frequency spectrum of a reflected wave signal after heterodyne detection (at a pressure of 150 mTorr).

FIG. 11 depicts a frequency spectrum of the reflected wave signal Sb at the point B after heterodyne detection, in the same plasma conditions as in the case of FIG. 8. From FIG. 11, a primary peak is substantially at 10.6 MHz, and side peaks are removed with the band pass filter 13d. Thus, although the reflected wave power is as small as 10 mW, and the frequency of the primary peak of the first high frequency power is shifted due to the frequency control, the signal after heterodyne detection is not frequency-shifted, and only the reflected wave signal of the first high frequency power can be received with a high precision. The first control block can enable immediately an optimum oscillating frequency and power amplification based upon the reflected wave signal. Further, the detection precision can be improved with additional heterodyne detection of a traveling wave signal, a result of which is that the control precision can be improved reliably. Particularly, in order to dispose contact holes and the like with a high aspect ratio in a semiconductor device, the supply of high frequency power with high controllability to plasmas of a low plasma pressure is crucial. The reflected wave strength can be detected with a high precision using the heterodyne detection signal as illustrated in FIG. 11, and an optimum control can be performed immediately.

Furthermore, according to the inventive method of the present invention, impedance matching can be achieved immediately, and plasma can be supplied efficiently with high frequency power, and therefore a capacity of the power amplification means can be made smaller. Further, since a frequency of using the servo motor mechanism of the impedance match block is reduced, a lifetime of a vacuum variable capacitor can be extended. Moreover, the vacuum variable capacitor can be replaced with a fixed capacitor so as to remove the servo motor mechanism in some cases.

The embodiments disclosed here are illustrative in all aspects, and shall not be taken as being limitative. The scope of the invention is not defined as the foregoing descriptions but as the claimed scope of the patent application, and shall encompass all modifications falling within the spirit and scope equivalent to the claimed scope of the patent application.

INDUSTRIAL APPLICABILITY

With the use of the inventive high frequency power supply device and high frequency power supplying method of the present invention, in an entire period starting from generation of plasmas until termination of plasmas, a high frequency signal can be received with a high precision, and a frequency and power amplification of high frequency power for generation of plasmas can be controlled to be optimum in a short time. The present invention is advantageous to controllability of stable generation of various types of plasmas, especially to controllability of plasmas with a low density, and accordingly is expected to particularly facilitate the miniaturization of various semiconductor devices.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive. Those skilled in the art will appreciate that many different combinations of hardware, software, and firmware will be suitable for practicing the present invention. For example, the described methods may be implemented in a wide variety of programming or scripting languages, such as Assembler, C/C++, perl, shell, PHP, Java, HFSS, CST, EEKO, etc.

The invention claimed is:

1. A high frequency power supply device, at least comprising a first high frequency power supply block, which supplies a plasma processing chamber with a high frequency power at a first frequency f1, and a second high frequency power supply block, which supplies the plasma processing chamber with a high frequency power at a second frequency f2 below the first frequency, wherein:
   the first high frequency power supply block comprises:
   a first high frequency oscillating block, which excites the high frequency power at the first frequency and has a variable frequency;
   a first power amplification block, which receives an output of the first high frequency oscillating block and amplifies the power thereof;
   a first directivity coupler, which receives a reflected wave from the plasma processing chamber and a traveling wave from the first power amplification block;
   a first reflected wave heterodyne detection block, which performs heterodyne detection of a reflected wave signal from the first directivity coupler; and
   a first control block, which receives a signal Sb after detection of the first reflected wave heterodyne detection block and a traveling wave signal Sc from the first directivity coupler, performs calculations based on signal Sb and signal Sc, and issues a frequency control signal S1 that controls an oscillating frequency of the first high frequency oscillating block and an output level signal S2 to control output of the first power amplification block;
   wherein:
   the second high frequency power supply block comprises:
   a second high frequency oscillating block, which excites the high frequency power at the second frequency and has a variable frequency;
   a second power amplification block, which receives an output of the second high frequency oscillating block and amplifies the power thereof;
   a second directivity coupler, which receives a reflected wave from the plasma processing chamber and a traveling wave from the second power amplification block;
   a second reflected wave detection block, which detects a reflected wave signal from the second directivity coupler; and
   a second control block, which receives a signal after detection of the second reflected wave detection block and a traveling wave signal from the second directivity coupler, and controls an oscillating frequency of the second high frequency oscillating block and an output of the second power amplification block.

2. The high frequency power supply device according to claim 1, wherein:
the first high frequency power supply block comprises a first traveling wave heterodyne detection block, which performs heterodyne detection of a traveling wave signal from the first directivity coupler; and,
the first control block receives a heterodyne detection signal of the traveling wave signal.

3. The high frequency power supply device according to claim 1, wherein:
the first high frequency power supply block comprises a first traveling wave heterodyne detection block, which performs heterodyne detection of a traveling wave signal from the first directivity coupler;
the first control block receives a heterodyne detection signal of the traveling wave signal;
the second reflected wave detection block is a second reflected wave heterodyne detection block, which performs heterodyne detection of the reflected wave signal; and
the second control block receives a signal after detection of the second reflected wave heterodyne detection block and controls the oscillating frequency of the second high frequency oscillating block and the output of the second power amplification block.

4. The high frequency power supply device according to claim 3, wherein:
the second high frequency power supply block comprises a second traveling wave heterodyne detection block, which performs heterodyne detection of a traveling wave signal from the second directivity coupler;
the second control block receives a heterodyne detection signal of the traveling wave signal.

5. The high frequency power supply device according to claim 4, further comprising one or more high frequency power supply blocks, which supply the plasma processing chamber with high frequency power and output high frequency power at a frequency different from the first and second frequencies.

6. The high frequency power supply device according to claim 5, wherein:
at least one of the one or more high frequency power supply blocks comprises: a heterodyne detection block, which performs heterodyne detection of at least a reflected wave signal of a reflected wave signal and a traveling wave signal; and a control block, which receives the reflected wave signal after detection of the heterodyne detection block and controls an oscillating frequency and an output of the high frequency power supply block.

7. The high frequency power supply device according to claim 1, wherein the first reflected wave heterodyne detection block comprises:
a first mixer receiving and mixing frequency f1 and frequency f2 to output a first mixed signal fm;
a first low pass filter receiving and filtering the first mixed signal to output a filtered signal H3;
a second mixer receiving and mixing signal H3 and the reflected wave Sa from the first directivity coupler to output signal H4;
a second low pass filter receiving and filtering signal H4 to output a filtered signal for the first control block.

8. The high frequency power supply device according to claim 1, wherein the first reflected wave heterodyne detection block comprises an oscillator providing a signal at a third frequency f3 and wherein the first reflected wave heterodyne detection block mixes the third frequency f3 with the reflected wave signal and wherein f1>f3>f2.

9. An RF power supply system for use with plasma chamber, comprising:
a variable frequency oscillator providing high RF frequency signal f1;
a power amplifier receiving and amplifying the high RF frequency signal f1;
a heterodyne detector receiving a reflected signal from the plasma chamber and generating a modulated signal corresponding to reflected power included within the reflected signal, wherein the reflected signal includes frequency f1 and RF bias frequency f3;
a controller receiving the modulated signal and providing a frequency control signal to control the output frequency of the variable frequency oscillator and an amplification control signal to control the output level of the power amplifier;
wherein the heterodyne detection comprises:
an oscillator providing a signal at a frequency f2, and wherein f1>f2>f3;
a first mixer receiving and mixing frequency f1 and frequency f2 to output a first mixed signal fm;
a first low pass filter receiving and filtering the first mixed signal to output a filtered signal H3;
a second mixer receiving and mixing signal H3 and the reflected wave Sa from the first directivity coupler to output signal H4;
a second low pass filter receiving and filtering signal H4 to output a filtered signal for the first control block.

10. The RF power supply system of claim 9, further comprising:
a second power amplifier receiving and amplifying the low RF frequency signal.

11. The RF power supply system of claim 10, further comprising an impedance matching circuit for coupling at least one of the high RF frequency signal and low RF frequency signal to the plasma chamber.

12. The RF power supply system of claim 11, wherein the second frequency oscillator comprises a second variable frequency oscillator, and wherein the system further comprises:
a second heterodyne detector receiving the reflected signal from the plasma chamber and generating a second modulated signal corresponding to reflected power included within the reflected signal; and
a second controller receiving the second modulated signal and providing a second frequency control signal to control the output of the second variable frequency oscillator.

* * * * *